US008941951B2

(12) United States Patent
Bennin et al.

(10) Patent No.: US 8,941,951 B2
(45) Date of Patent: Jan. 27, 2015

(54) HEAD SUSPENSION FLEXURE WITH INTEGRATED STRAIN SENSOR AND SPUTTERED TRACES

(71) Applicant: Hutchinson Technology Incorporated, Hutchinson, MN (US)

(72) Inventors: Jeffry S. Bennin, Hutchinson, MN (US); Jacob D. Bjorstrom, Hutchinson, MN (US); Peter F. Ladwig, Hutchinson, MN (US); Paul V. Pesavento, Hutchinson, MN (US); Zachary A. Pokornowski, Cokato, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 0 days.

(21) Appl. No.: 14/092,758

(22) Filed: Nov. 27, 2013

(65) Prior Publication Data
US 2014/0146649 A1 May 29, 2014

Related U.S. Application Data

(60) Provisional application No. 61/730,608, filed on Nov. 28, 2012.

(51) Int. Cl.
G11B 5/48 (2006.01)
C23C 28/00 (2006.01)
(Continued)

(52) U.S. Cl.
CPC ............... *C23C 28/00* (2013.01); *G11B 5/486* (2013.01); *G11B 5/5582* (2013.01); *G11B 5/59694* (2013.01)
USPC ...................... 360/244.1; 360/240; 360/265.9

(58) Field of Classification Search
USPC .................... 360/240, 244.1, 265.9
See application file for complete search history.

(56) References Cited

U.S. PATENT DOCUMENTS 3,320,556 A 5/1967 Schneider
4,299,130 A * 11/1981 Koneval .......................... 73/766
(Continued)

FOREIGN PATENT DOCUMENTS

EP 0591954 B1 4/1994
EP 0834867 B1 5/2007
(Continued)

OTHER PUBLICATIONS

U.S. Appl. No. 11/654,480, filed Oct. 12, 2010, Guo, Wei et al.
(Continued)

*Primary Examiner* — Wayne Young
*Assistant Examiner* — Carlos E Garcia
(74) *Attorney, Agent, or Firm* — Faegre Baker Daniels LLP

(57) ABSTRACT

Various embodiments concern a method for manufacturing a disk drive head suspension component. Such methods can comprise providing a head suspension component comprising a layer of insulating material on a spring metal layer. Such methods can further comprise forming a strain gauge element and a trace seed layer by depositing a first metal on the insulating material layer, such as by sputtering. The strain gauge element and the trace seed layer can be formed simultaneously by the depositing of the first metal as part of the same process step. The first metal can be of a strain gauge class of metal having relatively high resistivity, such as constantan. Such methods can further comprise plating a second metal on the trace seed layer to form one or more traces.

22 Claims, 3 Drawing Sheets

(51) Int. Cl.
  *G11B 5/55* (2006.01)
  *G11B 5/596* (2006.01)

(56) References Cited

U.S. PATENT DOCUMENTS

| | | | |
|---|---|---|---|
| 4,418,239 A | 11/1983 | Larson et al. | |
| 4,422,906 A | 12/1983 | Kobayashi | |
| 4,659,438 A | 4/1987 | Kuhn et al. | |
| 5,140,288 A | 8/1992 | Grunwell | |
| 5,320,272 A | 6/1994 | Melton et al. | |
| 5,321,568 A | 6/1994 | Hatam-Tabrizi | |
| 5,333,085 A | 7/1994 | Prentice et al. | |
| 5,427,848 A | 6/1995 | Baer et al. | |
| 5,459,921 A | 10/1995 | Hudson et al. | |
| 5,485,053 A | 1/1996 | Baz | |
| 5,491,597 A | 2/1996 | Bennin et al. | |
| 5,521,778 A | 5/1996 | Boutaghou et al. | |
| 5,526,208 A * | 6/1996 | Hatch et al. | 360/294.1 |
| 5,598,307 A | 1/1997 | Bennin | |
| 5,608,590 A | 3/1997 | Ziegler et al. | |
| 5,608,591 A | 3/1997 | Klaassen et al. | |
| 5,631,786 A | 5/1997 | Erpelding | |
| 5,636,089 A | 6/1997 | Jurgenson et al. | |
| 5,657,186 A | 8/1997 | Kudo et al. | |
| 5,657,188 A | 8/1997 | Jurgenson et al. | |
| 5,666,241 A | 9/1997 | Summers | |
| 5,666,717 A | 9/1997 | Matsumoto et al. | |
| 5,694,270 A | 12/1997 | Sone et al. | |
| 5,717,547 A | 2/1998 | Young | |
| 5,734,526 A | 3/1998 | Symons | |
| 5,737,152 A | 4/1998 | Balakrishnan | |
| 5,754,368 A | 5/1998 | Shiraishi et al. | |
| 5,764,444 A | 6/1998 | Imamura et al. | |
| 5,773,889 A | 6/1998 | Love et al. | |
| 5,790,347 A | 8/1998 | Girard | |
| 5,796,552 A | 8/1998 | Akin, Jr. et al. | |
| 5,805,382 A | 9/1998 | Lee et al. | |
| 5,812,344 A | 9/1998 | Balakrishnan | |
| 5,818,662 A | 10/1998 | Shum | |
| 5,862,010 A | 1/1999 | Simmons et al. | |
| 5,862,015 A * | 1/1999 | Evans et al. | 360/244.1 |
| 5,889,137 A | 3/1999 | Hutchings et al. | |
| 5,892,637 A | 4/1999 | Brooks, Jr. et al. | |
| 5,898,544 A | 4/1999 | Krinke et al. | |
| 5,914,834 A | 6/1999 | Gustafson | |
| 5,921,131 A | 7/1999 | Stange | |
| 5,924,187 A | 7/1999 | Matz | |
| 5,929,390 A * | 7/1999 | Naito et al. | 177/211 |
| 5,973,882 A | 10/1999 | Tangren | |
| 5,973,884 A | 10/1999 | Hagen | |
| 5,986,853 A | 11/1999 | Simmons et al. | |
| 5,995,328 A | 11/1999 | Balakrishnan | |
| 6,011,671 A | 1/2000 | Masse et al. | |
| 6,038,102 A | 3/2000 | Balakrishnan et al. | |
| 6,046,887 A | 4/2000 | Uozumi et al. | |
| 6,055,132 A | 4/2000 | Arya et al. | |
| 6,075,676 A | 6/2000 | Hiraoka et al. | |
| 6,078,470 A | 6/2000 | Danielson et al. | |
| 6,108,175 A | 8/2000 | Hawwa et al. | |
| 6,118,637 A | 9/2000 | Wright et al. | |
| 6,144,531 A | 11/2000 | Sawai | |
| 6,146,813 A | 11/2000 | Girard et al. | |
| 6,156,982 A | 12/2000 | Dawson | |
| 6,157,522 A | 12/2000 | Murphy et al. | |
| 6,172,853 B1 | 1/2001 | Davis et al. | |
| 6,181,520 B1 * | 1/2001 | Fukuda | 360/244.1 |
| 6,195,227 B1 | 2/2001 | Fan et al. | |
| 6,215,622 B1 | 4/2001 | Ruiz et al. | |
| 6,229,673 B1 | 5/2001 | Shinohara et al. | |
| 6,233,124 B1 | 5/2001 | Budde et al. | |
| 6,239,953 B1 | 5/2001 | Mei | |
| 6,246,546 B1 | 6/2001 | Tangren | |
| 6,246,552 B1 | 6/2001 | Soeno et al. | |
| 6,249,404 B1 | 6/2001 | Doundakov et al. | |
| 6,262,868 B1 | 7/2001 | Arya et al. | |
| 6,275,358 B1 | 8/2001 | Balakrishnan et al. | |
| 6,278,587 B1 | 8/2001 | Mei | |
| 6,282,062 B1 | 8/2001 | Shiraishi | |
| 6,295,185 B1 | 9/2001 | Stefansky | |
| 6,297,936 B1 | 10/2001 | Kant et al. | |
| 6,300,846 B1 | 10/2001 | Brunker | |
| 6,307,715 B1 | 10/2001 | Berding et al. | |
| 6,320,730 B1 | 11/2001 | Stefansky et al. | |
| 6,330,132 B1 | 12/2001 | Honda | |
| 6,349,017 B1 | 2/2002 | Schott | |
| 6,376,964 B1 | 4/2002 | Young et al. | |
| 6,396,667 B1 | 5/2002 | Zhang et al. | |
| 6,399,899 B1 | 6/2002 | Ohkawa et al. | |
| 6,400,532 B1 | 6/2002 | Mei | |
| 6,404,594 B1 | 6/2002 | Maruyama et al. | |
| 6,424,500 B1 | 7/2002 | Coon et al. | |
| 6,445,546 B1 | 9/2002 | Coon | |
| 6,459,549 B1 | 10/2002 | Tsuchiya et al. | |
| 6,490,228 B2 | 12/2002 | Killam | |
| 6,493,190 B1 | 12/2002 | Coon | |
| 6,493,192 B2 | 12/2002 | Crane et al. | |
| 6,539,609 B2 | 4/2003 | Palmer et al. | |
| 6,549,376 B1 | 4/2003 | Scura et al. | |
| 6,549,736 B2 | 4/2003 | Miyabe et al. | |
| 6,563,676 B1 | 5/2003 | Chew et al. | |
| 6,596,184 B1 | 7/2003 | Shum et al. | |
| 6,597,541 B2 | 7/2003 | Nishida et al. | |
| 6,600,631 B1 | 7/2003 | Berding et al. | |
| 6,621,653 B1 | 9/2003 | Schirle | |
| 6,621,658 B1 | 9/2003 | Nashif | |
| 6,636,388 B2 | 10/2003 | Stefansaky | |
| 6,639,761 B1 | 10/2003 | Boutaghou et al. | |
| 6,647,621 B1 | 11/2003 | Roen et al. | |
| 6,661,617 B1 | 12/2003 | Hipwell, Jr. et al. | |
| 6,661,618 B2 | 12/2003 | Fujiwara et al. | |
| 6,704,157 B2 | 3/2004 | Himes et al. | |
| 6,704,158 B2 | 3/2004 | Hawwa et al. | |
| 6,714,384 B2 | 3/2004 | Himes et al. | |
| 6,714,385 B1 | 3/2004 | Even et al. | |
| 6,728,057 B2 | 4/2004 | Putnam | |
| 6,728,077 B1 | 4/2004 | Murphy | |
| 6,731,472 B2 | 5/2004 | Okamoto et al. | |
| 6,735,052 B2 | 5/2004 | Dunn et al. | |
| 6,735,055 B1 | 5/2004 | Crane et al. | |
| 6,737,931 B2 | 5/2004 | Amparan et al. | |
| 6,738,225 B1 | 5/2004 | Summers et al. | |
| 6,741,424 B1 | 5/2004 | Danielson et al. | |
| 6,751,062 B2 | 6/2004 | Kasajima et al. | |
| 6,760,182 B2 | 7/2004 | Bement et al. | |
| 6,760,194 B2 | 7/2004 | Shiraishi et al. | |
| 6,760,196 B1 | 7/2004 | Niu et al. | |
| 6,762,913 B1 | 7/2004 | Even et al. | |
| 6,765,761 B2 | 7/2004 | Arya | |
| 6,771,466 B2 | 8/2004 | Kasajima et al. | |
| 6,771,467 B2 | 8/2004 | Kasajima et al. | |
| 6,791,802 B2 | 9/2004 | Watanabe et al. | |
| 6,796,018 B1 | 9/2004 | Thornton | |
| 6,798,597 B1 | 9/2004 | Aram et al. | |
| 6,801,402 B1 | 10/2004 | Subrahmanyam et al. | |
| 6,831,539 B1 | 12/2004 | Hipwell, Jr. et al. | |
| 6,833,978 B2 | 12/2004 | Shum et al. | |
| 6,839,204 B2 | 1/2005 | Shiraishi et al. | |
| 6,841,737 B2 | 1/2005 | Komatsubara et al. | |
| 6,856,075 B1 | 2/2005 | Houk et al. | |
| 6,898,042 B2 | 5/2005 | Subrahmanyan | |
| 6,900,967 B1 | 5/2005 | Coon et al. | |
| 6,922,305 B2 | 7/2005 | Price | |
| 6,934,127 B2 | 8/2005 | Yao et al. | |
| 6,942,817 B2 | 9/2005 | Yagi et al. | |
| 6,943,991 B2 | 9/2005 | Yao et al. | |
| 6,950,288 B2 | 9/2005 | Yao et al. | |
| 6,963,471 B2 | 11/2005 | Arai et al. | |
| 6,975,488 B1 | 12/2005 | Kulangara et al. | |
| 6,977,790 B1 | 12/2005 | Chen et al. | |
| 7,006,333 B1 | 2/2006 | Summers | |
| 7,016,159 B1 | 3/2006 | Bjorstrom et al. | |
| 7,020,949 B2 | 4/2006 | Muramatsu et al. | |
| 7,023,667 B2 | 4/2006 | Shum | |
| 7,050,267 B2 | 5/2006 | Koh et al. | |

(56) References Cited

U.S. PATENT DOCUMENTS

| | | |
|---|---|---|
| 7,057,857 B1 | 6/2006 | Niu et al. |
| 7,064,928 B2 | 6/2006 | Fu et al. |
| 7,079,357 B1 | 7/2006 | Kulangara et al. |
| 7,082,670 B2 | 8/2006 | Boismier et al. |
| 7,092,215 B2 | 8/2006 | Someya et al. |
| 7,130,159 B2 | 10/2006 | Shimizu et al. |
| 7,132,607 B2 | 11/2006 | Yoshimi et al. |
| 7,142,395 B2 | 11/2006 | Swanson et al. |
| 7,144,687 B2 | 12/2006 | Fujisaki et al. |
| 7,159,300 B2 | 1/2007 | Yao et al. |
| 7,161,767 B2 | 1/2007 | Hernandez et al. |
| 7,177,119 B1 | 2/2007 | Bennin et al. |
| 7,218,481 B1 | 5/2007 | Bennin et al. |
| 7,256,968 B1 | 8/2007 | Krinke |
| 7,271,958 B2 | 9/2007 | Yoon et al. |
| 7,292,413 B1 | 11/2007 | Coon |
| 7,307,817 B1 | 12/2007 | Mei |
| 7,322,241 B2 | 1/2008 | Kai |
| 7,336,436 B2 | 2/2008 | Sharma et al. |
| 7,342,750 B2 | 3/2008 | Yang et al. |
| 7,345,851 B2 | 3/2008 | Hirano et al. |
| 7,375,930 B2 | 5/2008 | Yang et al. |
| 7,379,274 B2 | 5/2008 | Yao et al. |
| 7,382,582 B1 | 6/2008 | Cuevas |
| 7,385,788 B2 | 6/2008 | Kubota et al. |
| 7,391,594 B2 | 6/2008 | Fu et al. |
| 7,403,357 B1 | 7/2008 | Williams |
| 7,408,745 B2 | 8/2008 | Yao et al. |
| 7,417,830 B1 | 8/2008 | Kulangara |
| 7,420,778 B2 | 9/2008 | Sassine et al. |
| 7,459,835 B1 | 12/2008 | Mei et al. |
| 7,460,337 B1 | 12/2008 | Mei |
| 7,466,520 B2 | 12/2008 | White et al. |
| 7,499,246 B2 | 3/2009 | Nakagawa |
| 7,509,859 B2 | 3/2009 | Kai |
| 7,518,830 B1 | 4/2009 | Panchal et al. |
| 7,567,410 B1 | 7/2009 | Zhang et al. |
| 7,595,965 B1 | 9/2009 | Kulangara et al. |
| RE40,975 E | 11/2009 | Evans et al. |
| 7,625,654 B2 | 12/2009 | Vyas et al. |
| 7,643,252 B2 | 1/2010 | Arai et al. |
| 7,649,254 B2 | 1/2010 | Graydon et al. |
| 7,663,841 B2 | 2/2010 | Budde et al. |
| 7,667,921 B2 | 2/2010 | Satoh et al. |
| 7,675,713 B2 | 3/2010 | Ogawa et al. |
| 7,688,552 B2 | 3/2010 | Yao et al. |
| 7,692,899 B2 | 4/2010 | Arai et al. |
| 7,701,673 B2 | 4/2010 | Wang et al. |
| 7,701,674 B2 | 4/2010 | Arai |
| 7,719,798 B2 | 5/2010 | Yao |
| 7,724,478 B2 | 5/2010 | Deguchi et al. |
| 7,751,153 B1 | 7/2010 | Kulangara et al. |
| 7,768,746 B2 | 8/2010 | Yao et al. |
| 7,782,572 B2 | 8/2010 | Pro |
| 7,813,083 B2 | 10/2010 | Tian et al. |
| 7,821,742 B1 | 10/2010 | Mei |
| 7,832,082 B1 | 11/2010 | Hentges et al. |
| 7,835,113 B1 | 11/2010 | Douglas |
| 7,872,344 B2 | 1/2011 | Fjelstad et al. |
| 7,875,804 B1 | 1/2011 | Tronnes et al. |
| 7,902,639 B2 * | 3/2011 | Garrou et al. ............... 257/622 |
| 7,914,926 B2 | 3/2011 | Kimura et al. |
| 7,923,644 B2 | 4/2011 | Ishii et al. |
| 7,924,530 B1 | 4/2011 | Chocholaty |
| 7,929,252 B1 | 4/2011 | Hentges et al. |
| 7,983,008 B2 | 7/2011 | Liao et al. |
| 7,986,494 B2 | 7/2011 | Pro |
| 8,004,798 B1 | 8/2011 | Dunn |
| 8,085,508 B2 | 12/2011 | Hatch |
| 8,089,728 B2 | 1/2012 | Yao et al. |
| 8,120,878 B1 | 2/2012 | Drape et al. |
| 8,125,736 B2 | 2/2012 | Nojima et al. |
| 8,125,741 B2 | 2/2012 | Shelor |
| 8,144,436 B2 | 3/2012 | Iriuchijima et al. |
| 8,149,542 B2 | 4/2012 | Ando et al. |
| 8,161,626 B2 | 4/2012 | Ikeji |
| 8,169,746 B1 | 5/2012 | Rice et al. |
| 8,174,797 B2 | 5/2012 | Iriuchijima |
| 8,189,301 B2 | 5/2012 | Schreiber |
| 8,194,359 B2 | 6/2012 | Yao et al. |
| 8,199,441 B2 | 6/2012 | Nojima |
| 8,228,642 B1 | 7/2012 | Hahn et al. |
| 8,248,731 B2 | 8/2012 | Fuchino |
| 8,248,734 B2 | 8/2012 | Fuchino |
| 8,248,735 B2 | 8/2012 | Fujimoto et al. |
| 8,248,736 B2 | 8/2012 | Hanya et al. |
| 8,254,062 B2 | 8/2012 | Greminger |
| 8,259,416 B1 | 9/2012 | Davis et al. |
| 8,264,797 B2 | 9/2012 | Emley |
| 8,289,652 B2 | 10/2012 | Zambri et al. |
| 8,295,012 B1 | 10/2012 | Tian et al. |
| 8,300,362 B2 | 10/2012 | Virmani et al. |
| 8,310,790 B1 | 11/2012 | Fanslau, Jr. |
| 8,331,061 B2 | 12/2012 | Hanya et al. |
| 8,339,748 B2 | 12/2012 | Shum et al. |
| 8,351,160 B2 | 1/2013 | Fujimoto |
| 8,363,361 B2 | 1/2013 | Hanya et al. |
| 8,379,349 B1 | 2/2013 | Pro et al. |
| 8,446,694 B1 | 5/2013 | Tian et al. |
| 8,456,780 B1 | 6/2013 | Ruiz |
| 8,498,082 B1 | 7/2013 | Padeski et al. |
| 8,526,142 B1 | 9/2013 | Dejkoonmak et al. |
| 8,542,465 B2 | 9/2013 | Liu et al. |
| 8,559,137 B2 | 10/2013 | Imuta |
| 8,665,565 B2 | 3/2014 | Pro et al. |
| 8,675,314 B1 | 3/2014 | Bjorstrom et al. |
| 8,681,456 B1 | 3/2014 | Miller et al. |
| 2001/0012181 A1 | 8/2001 | Inoue et al. |
| 2001/0013993 A1 | 8/2001 | Coon |
| 2001/0030838 A1 | 10/2001 | Takadera et al. |
| 2001/0043443 A1 | 11/2001 | Okamoto et al. |
| 2002/0075606 A1 | 6/2002 | Nishida et al. |
| 2002/0118492 A1 | 8/2002 | Watanabe et al. |
| 2002/0149888 A1 | 10/2002 | Motonishi et al. |
| 2002/0176209 A1 | 11/2002 | Schulz et al. |
| 2003/0011118 A1 | 1/2003 | Kasajima et al. |
| 2003/0011936 A1 | 1/2003 | Himes et al. |
| 2003/0053258 A1 | 3/2003 | Dunn et al. |
| 2003/0135985 A1 | 7/2003 | Yao et al. |
| 2003/0174445 A1 | 9/2003 | Luo |
| 2003/0202293 A1 | 10/2003 | Nakamura et al. |
| 2003/0210499 A1 | 11/2003 | Arya |
| 2004/0027727 A1 | 2/2004 | Shimizu et al. |
| 2004/0027728 A1 | 2/2004 | Coffey et al. |
| 2004/0070884 A1 | 4/2004 | Someya et al. |
| 2004/0125508 A1 | 7/2004 | Yang et al. |
| 2004/0181932 A1 | 9/2004 | Yao et al. |
| 2004/0207957 A1 | 10/2004 | Kasajima et al. |
| 2005/0061542 A1 | 3/2005 | Aonuma et al. |
| 2005/0063097 A1 | 3/2005 | Maruyama et al. |
| 2005/0105217 A1 | 5/2005 | Kwon et al. |
| 2005/0254175 A1 | 11/2005 | Swanson et al. |
| 2005/0280944 A1 | 12/2005 | Yang et al. |
| 2006/0044698 A1 | 3/2006 | Hirano et al. |
| 2006/0077594 A1 | 4/2006 | White et al. |
| 2006/0181812 A1 | 8/2006 | Kwon et al. |
| 2006/0193086 A1 | 8/2006 | Zhu et al. |
| 2006/0209465 A1 | 9/2006 | Takikawa et al. |
| 2006/0238924 A1 | 10/2006 | Gatzen |
| 2006/0274452 A1 | 12/2006 | Arya |
| 2006/0274453 A1 | 12/2006 | Arya |
| 2006/0279880 A1 | 12/2006 | Boutaghou et al. |
| 2007/0133128 A1 | 6/2007 | Arai |
| 2007/0153430 A1 | 7/2007 | Park et al. |
| 2007/0223146 A1 | 9/2007 | Yao et al. |
| 2007/0227769 A1 | 10/2007 | Brodsky et al. |
| 2007/0253176 A1 | 11/2007 | Ishii et al. |
| 2008/0084638 A1 | 4/2008 | Bonin |
| 2008/0144225 A1 | 6/2008 | Yao et al. |
| 2008/0192384 A1 | 8/2008 | Danielson et al. |
| 2008/0198511 A1 | 8/2008 | Hirano et al. |
| 2008/0229842 A1 * | 9/2008 | Ohtsuka et al. ............... 73/777 |
| 2008/0273266 A1 | 11/2008 | Pro |
| 2008/0273269 A1 | 11/2008 | Pro |

(56) References Cited

U.S. PATENT DOCUMENTS

| | | | |
|---|---|---|---|
| 2009/0027807 A1 | 1/2009 | Yao et al. | |
| 2009/0080117 A1 | 3/2009 | Shimizu et al. | |
| 2009/0135523 A1 | 5/2009 | Nishiyama et al. | |
| 2009/0147407 A1 | 6/2009 | Huang et al. | |
| 2009/0168249 A1* | 7/2009 | McCaslin et al. | 360/245.3 |
| 2009/0176120 A1 | 7/2009 | Wang | |
| 2009/0190263 A1 | 7/2009 | Miura et al. | |
| 2009/0244786 A1 | 10/2009 | Hatch | |
| 2009/0294740 A1 | 12/2009 | Kurtz et al. | |
| 2010/0067151 A1 | 3/2010 | Okawara et al. | |
| 2010/0073825 A1 | 3/2010 | Okawara | |
| 2010/0097726 A1 | 4/2010 | Greminger et al. | |
| 2010/0143743 A1 | 6/2010 | Yamasaki et al. | |
| 2010/0165515 A1 | 7/2010 | Ando | |
| 2010/0165516 A1 | 7/2010 | Fuchino | |
| 2010/0177445 A1 | 7/2010 | Fuchino | |
| 2010/0195252 A1 | 8/2010 | Kashima | |
| 2010/0208390 A1 | 8/2010 | Hanya et al. | |
| 2010/0220414 A1 | 9/2010 | Klarqvist et al. | |
| 2010/0246071 A1 | 9/2010 | Nojima et al. | |
| 2010/0271735 A1 | 10/2010 | Schreiber | |
| 2010/0290158 A1 | 11/2010 | Hanya et al. | |
| 2011/0013319 A1 | 1/2011 | Soga et al. | |
| 2011/0058282 A1 | 3/2011 | Fujimoto et al. | |
| 2011/0096438 A1 | 4/2011 | Takada et al. | |
| 2011/0096440 A1* | 4/2011 | Greminger | 360/245.3 |
| 2011/0123145 A1 | 5/2011 | Nishio | |
| 2011/0141624 A1 | 6/2011 | Fuchino et al. | |
| 2011/0228425 A1 | 9/2011 | Liu et al. | |
| 2011/0242708 A1 | 10/2011 | Fuchino | |
| 2011/0279929 A1 | 11/2011 | Kin | |
| 2011/0299197 A1 | 12/2011 | Eguchi | |
| 2012/0002329 A1 | 1/2012 | Shum et al. | |
| 2012/0113547 A1 | 5/2012 | Sugimoto | |
| 2012/0281316 A1 | 11/2012 | Fujimoto et al. | |
| 2013/0242434 A1 | 9/2013 | Bjorstrom et al. | |
| 2013/0242436 A1 | 9/2013 | Yonekura et al. | |
| 2013/0265674 A1 | 10/2013 | Fanslau | |
| 2014/0022670 A1 | 1/2014 | Takikawa et al. | |
| 2014/0022671 A1 | 1/2014 | Takikawa et al. | |
| 2014/0022674 A1 | 1/2014 | Takikawa et al. | |
| 2014/0022675 A1 | 1/2014 | Hanya et al. | |
| 2014/0063660 A1 | 3/2014 | Bjorstrom et al. | |
| 2014/0078621 A1 | 3/2014 | Miller et al. | |
| 2014/0098440 A1 | 4/2014 | Miller et al. | |

FOREIGN PATENT DOCUMENTS

| | | |
|---|---|---|
| JP | 9198825 A | 7/1997 |
| JP | 10003632 A | 1/1998 |
| JP | 2001057039 A | 2/2001 |
| JP | 2001202731 A | 7/2001 |
| JP | 2001307442 A | 11/2001 |
| JP | 2002050140 A | 2/2002 |
| JP | 2002170607 A | 6/2002 |
| JP | 2003223771 A | 8/2003 |
| JP | 2004039056 A | 2/2004 |
| JP | 2004300489 A | 10/2004 |
| JP | 2005209336 A | 8/2005 |
| WO | WO9820485 A1 | 5/1998 |

OTHER PUBLICATIONS

International Search Report and Written Opinion issued in PCT/US2013/059702, dated Mar. 28, 2014, 9 pages.
Cheng, Yang-Tse, "Vapor deposited thin gold coatings for high temperature electrical contacts", Electrical Contacts, 1996, Joint with the 18th International Conference on Electrical Contacts, Proceedings of the Forty-Second IEEE Holm Conference, Sep. 16-20, 1996 (abstract only).
Fu, Yao, "Design of a Hybrid Magnetic and Piezoelectric Polymer Microactuator", a thesis submitted to Industrial Research Institute Swinburne (IRIS), Swinburne University of Technology, Hawthorn, Victoria, Australia, Dec. 2005.
Harris, N.R. et al., "A Multilayer Thick-film PZT Actuator for MEMs Applications", Sensors and Actuators A: Physical, vol. 132, No. 1, Nov. 8, 2006, pp. 311-316.
International Search Report and Written Opinion issued in PCT/US13/75320, mailed May 20, 2014, 10 pages.
International Search Report and Written Opinion issued in PCT/US2013/031484, mailed May 30, 2013, 13 pages.
International Search Report and Written opinion issued in PCT/US2013/052885, mailed Feb. 7, 2014, 13 pages.
International Search Report and Written Opinion issued in PCT/US2013/064314, dated Apr. 18, 2014, 10 pages.
Jing, Yana, "Fabrication of piezoelectric ceramic micro-actuator and its reliability for hard disk drives", Ultrasonics, Ferroelectrics and Frequency Control, IEEE, vol. 51, No. 11, Nov. 2004, pp. 1470-1476 (abstract only).
Kon, Stanley et al., "Piezoresistive and Piezoelectric MEMS Strain Sensors for Vibration Detection", Sensors and Smart Structures Technologies for Civil, Mechanical, and Aerospace Systems 2007, Proc. of SPIE vol. 6529.
Lengert, David et al., "Design of suspension-based and collocated dual stage actuated suspensions", Microsyst (2012) 18:1615-1622.
Li, Longqiu et al., "An experimental study of the dimple-gimbal interface in a hard disk drive", Microsyst Technol (2011) 17:863-868.
Pichonat, Tristan et al., "Recent developments in MEMS-based miniature fuel cells", Microsyst Technol (2007) 13:1671-1678.
Raeymaekers, B. et al., "Investigation of fretting wear at the dimple/gimbal interface in a hard disk drive suspension", Wear, vol. 268, Issues 11-12, May 12, 2010, pp. 1347-1353.
Raeymaekers, Bart et al., "Fretting Wear Between a Hollow Sphere and Flat Surface", Proceedings of the STLE/ASME International Joint Tribology Conference, Oct. 19-21, 2009, Memphis, TN USA, 4 pages.
Rajagopal, Indira et al., "Gold Plating of Critical Components for Space Applications: Challenges and Solutions", Gold Bull., 1992, 25(2), pp. 55-66.
U.S. Appl. No. 13/365,443 to Miller, Mark A., entitled Elongated Trace Tethers for Disk Drive Head Suspension Flexures, filed Feb. 3, 2012.
U.S. Appl. No. 13/690,883 to Tobias, Kyle T. et al., entitled Microstructure Patterned Surfaces for Integrated Lead Head Suspensions, filed Nov. 30, 2012.
U.S. Appl. No. 13/827,622 to Bjorstrom, Jacob D. et al., entitled Mid-Loadbeam Dual Stage Actuated (DSA) Disk Drive Head Suspension, filed Mar. 14, 2013.
U.S. Appl. No. 14/056,481 entitled Two-Motor Co-Located Gimbal-Based Dual Stage Actuation Disk Drive Suspensions With Motor Stiffeners, filed Oct. 17, 2013.
U.S. Appl. No. 14/103,955 to Bjorstrom, Jacob D. et al., entitled Electrical Contacts to Motors in Dual Stage Actuated Suspensions, filed Dec. 12, 2013.
U.S. Appl. No. 14/141,617 to Bennin, Jeffry S. et al., entitled Disk Drive Suspension Assembly Having a Partially Flangeless Load Point Dimple, filed Dec. 27, 2013, 53 pages.
U.S. Appl. No. 14/145,515 to Miller, Mark A. et al., entitled Balanced Co-Located Gimbal-Based Dual Stage Actuation Disk Drive Suspensions, filed Dec. 31, 2013, 39 pages.
U.S. Appl. No. 14/216,288 to Miller, Mark A. et al., entitled Co-Located Gimbal-Based Dual Stage Actuation Disk Drive Suspension, filed Mar. 17, 2014, 84 pages.
U.S. Appl. No. 61/396,239 entitled Low Resistance Ground Joints for Dual Stage Actuation Disk Drive Suspensions, filed May 24, 2010, 16 pages.
U.S. Appl. No. 13/955,204 to Bjorstrom, Jacob D. et al., entitled Damped Dual Stage Actuation Disk Drive Suspensions, filed Jul. 31, 2013.
U.S. Appl. No. 13/955,204, to Bjorstrom, Jacob D. et al., Non-Final Office Action issued on Mar. 24, 2014, 7 pages.
U.S. Appl. No. 13/955,204, to Bjorstrom, Jacob D. et al., Non-Final Office Action issued on Oct. 29, 2013, 9 pages.
U.S. Appl. No. 13/955,204, to Bjorstrom, Jacob D. et al., Notice of Allowance issued on Jan. 7, 2014, 6 pages.
U.S. Appl. No. 13/955,204, to Bjorstrom, Jacob D. et al., Notice of Allowance issued on May 6, 2014, 5 pages.

(56) References Cited

OTHER PUBLICATIONS

U.S. Appl. No. 13/955,204, to Bjorstrom, Jacob D. et al., Response filed Apr. 18, 2014 to Non-Final Office Action issued on Mar. 24, 2014, 9 pages.

U.S. Appl. No. 13/955,204, to Bjorstrom, Jacob D. et al., Response filed Nov. 19, 2013 to Non-Final Office Action issued on Oct. 29, 2013, 11 pages.

U.S. Appl. No. 13/972,137 to Bjorstrom, Jacob D. et al., entitled Co-Located Gimbal-Based Dual Stage Actuation Disk Drive Suspensions With Offset Motors, filed Aug. 21, 2013.

U.S. Appl. No. 13/972,137, to Bjorstrom, Jacob D. et al., Non-Final Office Action issued Nov. 5, 2013.

U.S. Appl. No. 13/972,137, to Bjorstrom, Jacob D. et al., Notice of Allowance issued on Jan. 17, 2014, 5 pages.

U.S. Appl. No. 13/972,137, to Bjorstrom, Jacob D. et al., Response filed Dec. 2, 2013 to Non-Final Office Action issued Nov. 5, 2013, 12 pages.

U.S. Appl. No. 14/026,427 to Miller, Mark A., entitled Co-Located Gimbal-Based Dual Stage Actuation Disk Drive Suspensions, filed Sep. 13, 2013.

U.S. Appl. No. 14/044,238 to Miller, Mark A., entitled Co-Located Gimbal-Based Dual Stage Actuation Disk Drive Suspensions With Motor Stifeners, filed Oct. 2, 2013.

U.S. Appl. No. 14/044,238 to Miller, Mark A., Non-Final Office Action issued on Feb. 6, 2014, 9 pages.

U.S. Appl. No. 14/044,238, to Miller, Mark A., Response filed Apr. 22, 2014 to Non-Final Office Action issued on Feb. 6, 2014, 11 pages.

U.S. Appl. No. 14/050,660 to Miller, Mark A. et al., entitled Co-Located Gimbal-Based Dual Stage Actuation Disk Drive Suspensions With Dampers, filed Oct. 10, 2013.

U.S. Appl. No. 14/050,660, to Miller, Mark A. et al., Non-Final Office Action issued on Mar. 31, 2014, 9 pages.

Yoon, Wonseok et al., "Evaluation of coated metallic bipolar plates for polymer electrolyte membrane fuel cells", The Journal of Power Sources, vol. 179, No. 1, Apr. 15, 2008, pp. 265-273.

\* cited by examiner

HEAD SUSPENSION FLEXURE WITH INTEGRATED STRAIN SENSOR AND SPUTTERED TRACES

CROSS-REFERENCE TO RELATED APPLICATION

This application claims the benefit of U.S. Provisional Application Ser. No. 61/730,608 filed on Nov. 28, 2012, and entitled Head Suspension Flexure with Integrated Strain Sensor and Sputtered Traces, which is incorporated herein by reference in its entirely for all purposes.

TECHNICAL FIELD

The present invention relates generally to disk drive head suspensions. In particular, embodiments concern a disk drive head suspension flexure having integrated traces and an integrated strain sensor.

BACKGROUND OF THE INVENTION

Integrated lead disk drive head suspensions having strain gauge sensors for measuring parameters such as shock and vibrations are generally known and disclosed. Suspensions of these types are, for example, shown in the U.S. Pat. No. 7,813,083 to Guo et al., U.S. patent application no. 2009/0168249 to McCaslin et al., U.S. patent application no. 2008/0229842 to Ohtsuka et al., and U.S. patent no. RE 40,975 to Evans et al., each of which is incorporated herein by reference in its entirety for all purposes.

There remains a continuing need for suspensions with integrated leads or traces having characteristics capable of being optimized for different applications and electrical characteristics. There is also a need for suspensions with improved sensors. In particular, there is a need for suspensions with sensors that can accurately measure parameters such as shock and vibration associated with the suspensions. The suspensions should be capable of being efficiently manufactured.

SUMMARY

Various embodiments concern a method for manufacturing a disk drive head suspension component. Such methods can comprise providing a head suspension component comprising a layer of insulating material on a spring metal layer. Such methods can further comprise forming a strain gauge element and a trace seed layer by depositing a first metal on the insulating material layer. The strain gauge element and the trace seed layer can be formed simultaneously by the depositing of the first metal as part of the same process step. The first metal can be of a strain gauge class of metal having relatively high resistivity, such as constantan. Such methods can further comprise depositing a second metal on the trace seed layer to form one or more traces that are separate from the strain gauge element. Depositing the second metal can comprise plating the second metal on the trace seed layer. The first metal can have a higher resistivity than the second metal. The first metal can be deposited by a sputtering process. The second metal can be deposited by a plating process.

Various embodiments concern a head suspension component of a disk drive. Such a head suspension component can comprise a spring metal layer and an insulating material layer on the spring metal layer. Such a head suspension component can further comprise a strain gauge sensor formed from a deposited layer of strain gauge metal on the insulating material layer and a trace extending along the insulating material layer. The trace can comprise a seed layer formed from the strain gauge metal. The trace can further comprise a conductive metal plated on the seed layer. The strain gauge metal can have a higher resistivity than the conductive metal. For example, the strain gauge metal can be constantan while the conductive metal can be copper, gold, platinum, or an alloy thereof. The first metal can be deposited by a sputtering process and the second metal can be deposited by a plating process. The strain gauge sensor can comprise a series of linear portions of the deposited layer of strain gauge metal in a serpentine pattern.

Various embodiments concern a method of manufacturing an integrated lead suspension component of a flexure. Such a method can comprise depositing a layer of insulating material on a layer of spring metal of the flexure, then sputtering a seed layer of high resistance metal on a plurality of portions of the layer of insulating material, and then forming a plurality of traces by plating a low resistance conductive metal on the seed layer along the plurality of portions.

Further features and modifications of the various embodiments are further discussed herein and shown in the drawings.

While multiple embodiments are disclosed, still other embodiments of the present disclosure will become apparent to those skilled in the art from the following detailed description, which shows and describes illustrative embodiments of this disclosure. Accordingly, the drawings and detailed description are to be regarded as illustrative in nature and not restrictive.

DESCRIPTION OF THE INVENTION

Figure 1:
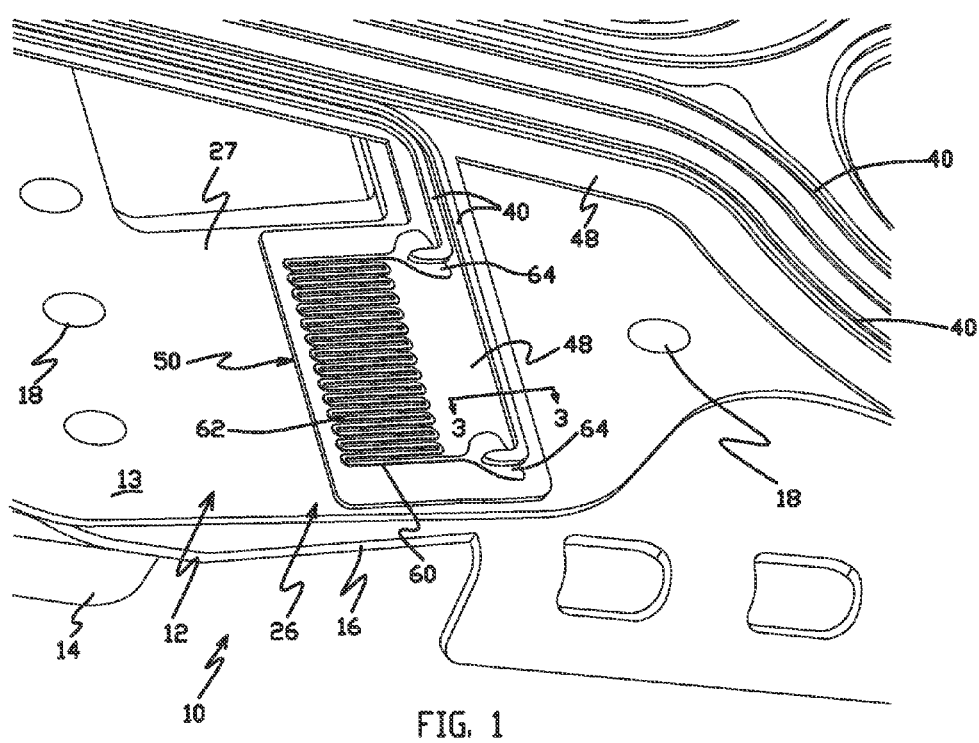
FIG. 1 is a detailed isometric view of a portion of a head suspension having a flexure.
Figure 2:
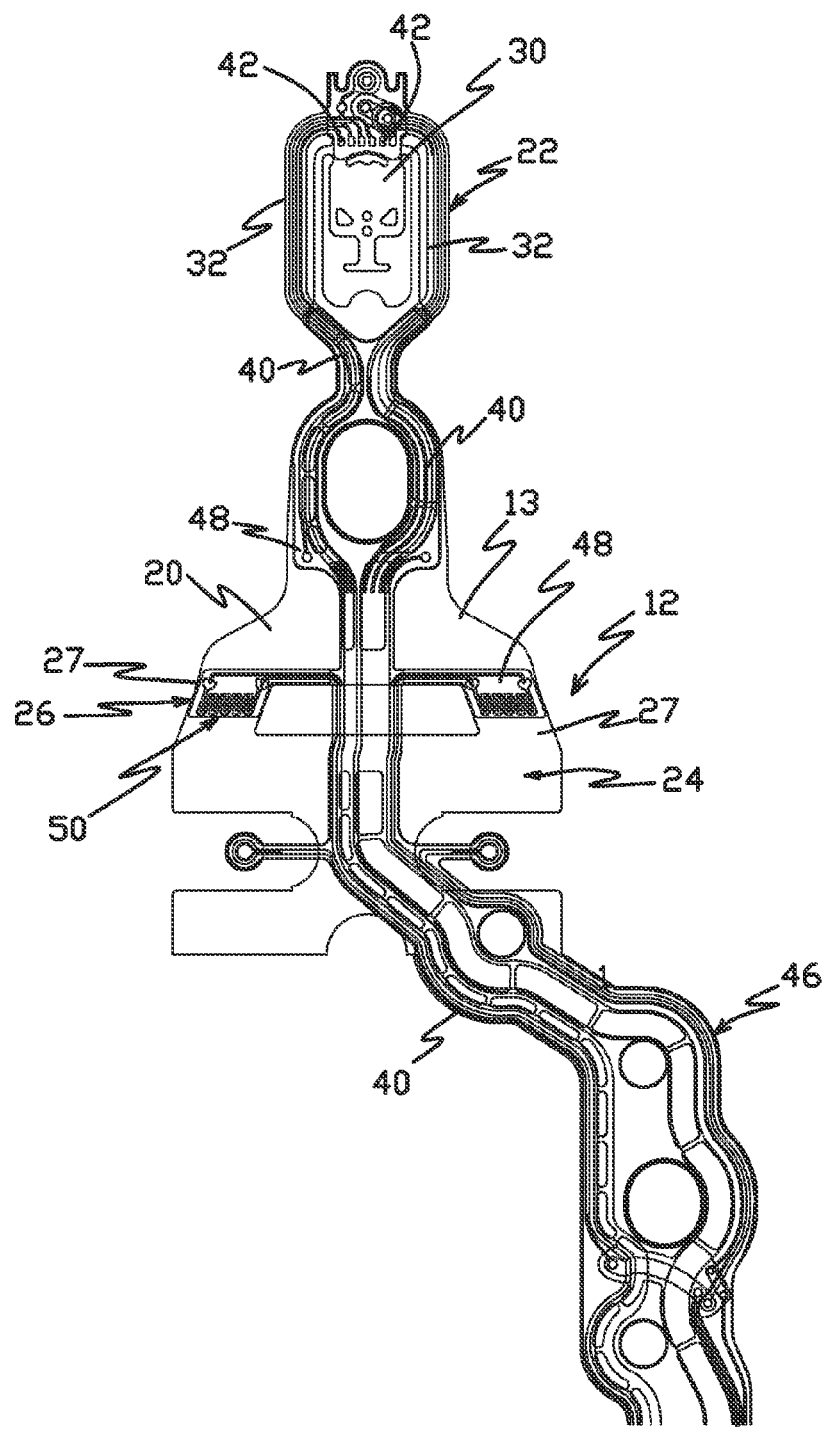
FIG. 2 is a plan view of the flexure shown in FIG. 1.

A portion of a disk drive head suspension 10 in accordance with various embodiments of the invention is shown in FIG. 1. As shown, the head suspension 10 includes a flexure 12 mounted to a baseplate 14 and a loadbeam 16. The flexure 12 is attached to the baseplate 14 and the loadbeam 16 by welds 18. As shown in FIG. 2, the flexure 12 comprises a spring metal layer 13. The spring metal layer 13 can be formed from a layer of stainless steel. The spring metal layer 13 can provide most or all of the mechanical support of the flexure 12. As illustrated, the flexure 12 includes a base or load beam mounting region 20, a gimbal region 22 on a distal end of the load beam mounting region 20, a baseplate mounting region 24 on the proximal end of the flexure 12, and a radius or primary spring region 26 between the load beam mounting region 20 and the baseplate mounting region 24. The gimbal region 22 includes a slider mounting region 30 that is supported by a pair of spring arms 32. The primary spring region 26 includes a pair of spaced-apart legs 27, the legs 27 on opposite lateral sides of the flexure 12 and separated by a void in the flexure 12 between the legs 27.

A plurality of conductive leads or traces 40 run along the flexure 12. For example, some traces 40 extend between slider bond pads 42 on the gimbal region 22 and terminal pads (not shown) on a tail 46 of the flexure 12. Traces 40 are electrically isolated from the spring metal layer 13 by an insulating material layer 48 (e.g., a polymer such as polyimide or other dielectric material) between the spring metal layer 13 and the traces 40. Each trace 40 serves as a section of an electrical circuit, the flexure 12 including a plurality of different (e.g., electrically isolated) electrical circuits formed at least in part by the plurality of traces 40. For example, some traces 40 can electrically connect to the slider bond pads 42 to electrically connect with read/write elements of a head slider (not illustrated). Various traces 40 can power or otherwise utilize elements on the head suspension 10, such as piezoelectric motors used in dual stage actuation applications, sensors (e.g., a strain gauge), and/or other elements.

It is noted that a flexure can take forms other than that shown, and may include and/or omit portions or elements disclosed herein. For example, the flexure 12 may not include a portion that functions as a primary spring region 26. A greater or lesser number of traces 40 may be present than that shown. The traces 40 may extend along greater, lesser, and/or alternative areas than that shown.

The illustrated embodiment of flexure 12 includes an integrated strain transducer or sensor 50. The sensor 50 is shown on one of the legs 27 of the spring region 26 in FIG. 1, although another sensor 50 is shown on the other leg 27 in FIG. 2. The sensor 50 can additionally or alternatively be located at different locations on the flexure 12 including on the gimbal spring arms 32, the loadbeam mounting region 20, the baseplate mounting region 24, or other spring region, for example. As shown, the sensor 50 includes a strain gauge element 60. As shown, the strain gauge element 60 can be disposed directly on a first side of the insulating material layer 48. The second side of the insulating material layer 48 (opposite the first side) is disposed directly on the spring metal layer 13.

The strain gauge element 60 is shown in FIG. 1 as a series of linear portions 62 connected at their opposite ends to form a zigzag or serpentine pattern. The linear portions 62 double back to extend parallel with each other. Other patterns are possible. The strain gauge element 60 comprises a long, thin conductive strip of metal suitable for measuring strain by changing in resistance in a stable and predictable manner. The strain gauge element 60 can, for example, be a thin film metal element. Stress that stretches or compacts the flexure 12 changes a dimension (e.g., cross sectional area) of the strain gauge element 60, which changes the electrical resistance across the strain gauge element 60. Ends of the strain gauge element 60 terminate at sensor bond pads 64. The resistance measured across the bond pads 64 will be sensitive to strain in the flexure 12 or other element on which the strain gauge element 60 is integrated. Traces 40 extend from the sensor bond pads 64 to connect to a measurement circuit for detecting strain in the flexure 12 based on the measured resistance. The repeated pattern of the linear portions 62 of the strain gauge element 60 allows for a multiplicatively larger change in resistance.

The strain gauge element 60 can be formed from a relatively high resistance metal, such as an alloy. Such high resistance metals can include constantan, which is a copper-nickel alloy. The strain gauge element 60 can be formed from any of a strain gauge alloy class of metals. In still other embodiments, the strain gauge element 60 can be formed from other suitable metals. In some cases, the strain gauge element 60 can be formed from conductive epoxy or a non-metal conductive material. The strain gauge element 60 can be formed from more than one layer of material. For example, the sensor 50 can be formed from several layers of conductive material, including a corrosion resistant outer layer disposed on top of the strain gauge element 60. A protective insulating layer or other polymer outer layer can also be provided over the strain gauge element 60. The additional layer on the strain gauge element 60 can be a metal layer. For example, a layer of chrome can be disposed over the strain gauge element 60.

Photolithographic processes such as photoresist masking and wet and dry etching, and material deposition processes such as coating, sputtering, and electroplating, can be used to form the insulating material layer 48 and/or the strain gauge element 60 of the sensor 50. Other embodiments can use other processes and materials to form the sensor 50. For example, the strain gauge element 60, and optionally other structures on the flexure 12, can be formed from laminated material stock (e.g., material having a base layer of stainless steel, an intermediary insulating material layer, and conductive metal deposited on the insulating material layer) using subtractive processes including photolithography and etching.

Figure 3:
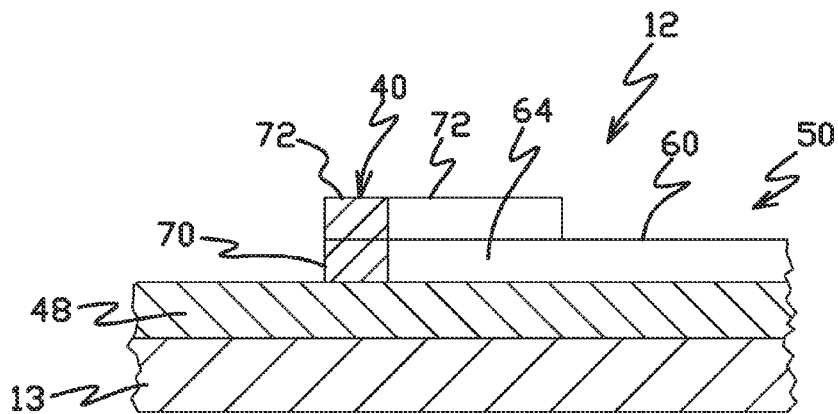
FIG. 3 is a detailed sectional view of a portion of the flexure shown in FIG. 1, taken along lines 3-3 in FIG. 1.

FIG. 3 is a cross sectional view of a portion of the flexure 12 taken along line 3-3 of FIG. 1, illustrating the trace 40 and sensor 50. In this embodiment, the insulating material layer 48 is formed by coating and patterning polyimide or other insulating material on the spring metal layer 13. The strain gauge element 60 and bond pads 64 of the sensor 50 are formed by depositing a layer of strain gauge metal on the insulating material layer 48. In various embodiments, the strain gauge element 60 and bond pads 64 of the sensor 50 can be deposited by sputtering constantan or other suitable metal on the insulating material layer 48. The strain gauge element 60 and bond pads 64 can, for example, be patterned by photolithographic and etching processes after an area of the metal has been sputtered onto the insulating material layer 48. Alternatively, the strain gauge element 60 and bond pads 64 can be formed by sputtering the strain gauge metal onto a portion of the insulating material layer 48 having a pattered photoresist mask. In some embodiments, the linear portions 62 of the strain gauge element 60 can have a thickness between about .01 µm and 2 µm, and widths between about 5 µm and 20 µm. Other embodiments can have a sensor 50 with different thicknesses and/or lengths. The sensor 50 can offer a number of important advantages. For example, the strain gauge element 60 can be precisely placed to allow for repeatability in measurements and minimal position and part-to-part variation. The strain gauge element 60 can also be efficiently fabricated with other sections of the flexure 14, as further discussed herein.

Traces 40 can be formed in various ways. For example, at least part of each trace can be formed by plating (e.g., electroplating or electroless plating) with a low resistance metal. However, such plating technique may require a seed layer on which to initially plate (e.g., as an electrical reference for the plating process) as the plating process may not be able to apply the plating material directly to the insulating material layer 48. For example, a seed layer can provide a thin layer to catalyze the additive plating process. The seed layer can be deposited by sputtering, physical vapor deposition, chemical vapor deposition, or vacuum deposition processes. In this way, each trace 40 can be formed from a first process step of depositing a seed layer on the insulating material layer 48 and then a second process step of depositing conductor material on the seed layer, the first process step being a different type of process than the second processing step. The deposited conductor material of the second process step may be a different type of metal as compared to the seed layer, such that the trace 40 is formed from different layers of different metals. In some alternative embodiments, an entire trace is deposited by a sputtering, physical vapor deposition, chemical vapor deposition, or vacuum deposition processes without a later plating step. Various techniques for forming conductive layers are disclosed in U.S. Pat. No. 7,835,112 to Danielson et al. and U.S. Pat. No. 6,251,781 to Zhou et al., each of which is incorporated by reference herein in its entirely for all purposes.

To minimize process steps and provide other benefits, the seed layer 70 of the trace 40 can be deposited in the same process step as the depositing of the strain gauge element 60 on the insulating material layer 48. In this way, the seed layer 70 of the trace 40 and the strain gauge element 60 are formed from the same type of material, the material configured to function as a strain gauge element 60 (e.g., by having relatively high resistivity) and to function as an acceptable seed layer 70 for the trace 40. The seed layer 70 may then be plated with further conductive metal (e.g., metal having lower resistance than the seed layer 70, such as copper, gold, platinum, or an alloy thereof) to provide good electrical performance characteristics typical of a trace 40.

In the embodiment of the flexure 12 shown in FIG. 3, a seed layer 70 for the trace 40 (which in this case electrically connects to the strain gauge element 60), and optionally other traces 40 on the flexure, is formed using the same process used to form the strain gauge element 60 of the sensor 50. The process used to form the seed layer 70 of the traces 40 can, but need not be, performed simultaneously with the process used to form the strain gauge element 60. In some cases, the seed layer 70 for the trace 40 and the strain gauge element 60 can be co-planar on the insulating material layer 48 due to being formed in the same process step. In the illustrated embodiment, an additional layer 72 of conducting material is deposited (e.g., by plating) on the seed layer 70. The additional layer 72 can comprise copper or copper alloy, for example. The additional layer 72 can be formed from a different type of metal having lower electrical resistance than the type of metal used to form the seed layer 70. The seed layer 70 for the traces 40 and the strain gauge element 60 of the sensor 50 can be formed at the same time and by using the same materials. In some other embodiments, the traces 40 and sensor 50 can have other structural components and can be formed separately. Other materials and processes are used to form the sensor 50 in other embodiments.

While FIG. 3 illustrates a trace 40 that is electrically connected to a strain gauge element 60, the same process (and process step) can be used to form seed layers 70 of traces 40 that are not electrically connected to a strain gauge element. For example, the same process can be used to form a seed layer 70 of a trace 40 that electrically connects to the slider bond pads 42 or other element. As such, a processing step that forms the strain gauge element 60 (and optionally other strain gauge elements) can also form seed layers 70 of traces 40 that are positionally and electrically separate from the strain gauge element 60 (or any strain gauge element).

Figure 4:
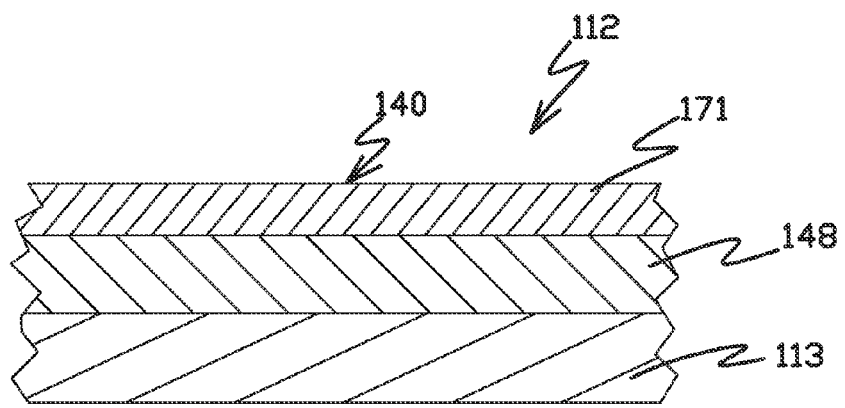
FIG. 4 is a detailed sectional view of a portion of a flexure showing a trace.

FIG. 4 is a section of a portion of a flexure 112 in accordance with another embodiment. The flexure 112 can be configured similarly to any other embodiment disclosed herein except where noted. Features of the flexure 112 that are the same or similar to those of other embodiments are indicated by similar reference numbers. As shown, the flexure 112 includes a spring metal layer 113, an insulating material layer 148, and a trace 140 on the insulating material layer 148. The trace 140 is formed by a sputtered material layer 171. The sputtered material layer 171 can be formed from a strain gauge class of metal (e.g., constantan or other high resistivity metal). In some embodiments, the sputtered material layer 171 can be formed using materials and processes, and can have dimensions, that are the same as or similar to those used to form a seed layer described above. In the illustrated embodiment, the conductive portion of trace 140 is formed solely, or at least substantially, of the sputtered material layer 171, and as such is not formed by the deposit of metal by other processes (e.g., plating) or is formed by other such process to a significantly lesser degree than the sputtering process step. In other embodiments (not shown), the trace 140 can have a coating or other layer such as a protective polymer insulating layer opposite the insulating material layer 148. Sputtered material layer 171 can have a tailored and relatively high resistance that provides advantageous electrical characteristics in certain applications. It will be understood that the cross section of FIG. 4 can represent a plurality of different traces of a flexure.

Although the present invention has been described with reference to preferred embodiments, those skilled in the art will recognize that changes can be made in form and detail without departing from the spirit and scope of the invention. For example, the various features of the illustrated embodiments can be combined with features of other embodiments. As such, the various embodiments disclosed herein can be modified in view of the features of other embodiments, such as by omitting and/or adding features.

The invention claimed is:

1. A method of manufacturing a disk drive head suspension component, the method comprising:
   providing a head suspension component comprising an insulating material layer on a spring metal layer;
   forming each of a strain gauge element and a trace seed layer by depositing a layer of a first metal on the insulating material layer, the strain gauge element and the trace seed layer formed on different portions of the insulating material layer with respect to each other; and
   depositing a layer of a second metal on the trace seed layer to form a trace, the first metal comprising a different type of metal than the second metal.

2. The method of claim 1, wherein the first metal is a strain gauge alloy and the second metal is copper.

3. The method of claim 1, wherein depositing the layer of the second metal comprises plating the second metal on the trace seed layer.

4. The method of claim 1, wherein the first metal has higher resistivity than the second metal.

5. The method of claim 1, wherein the first metal is deposited by sputtering to form the strain gauge element and the trace seed layer.

6. The method of claim 1, wherein the strain gauge element and the trace seed layer are formed simultaneously by the depositing of the first metal.

7. The method of claim 1, wherein the first metal is a strain gauge alloy.

8. The method of claim 1, wherein the first metal is constantan.

9. The method of claim 1, wherein the strain gauge element is formed by depositing the first metal in a serpentine pattern comprising a series of linear portions.

10. The method of claim 1, further comprising depositing an additional layer of material on the strain gauge element.

11. The method of claim 1, wherein providing the head suspension component comprises:
    providing a stainless steel layer; and
    depositing the insulating material layer on the stainless steel layer.

12. The method of claim 11, further comprising forming a flexure having one or more of a gimbal region including spring arms, a load beam mounting region, a primary spring region, and a baseplate mounting region, wherein forming the strain gauge and the trace seed layer comprises depositing the first metal on one or more of the gimbal region, the load beam mounting region, the primary spring region, and the baseplate mounting region.

13. A head suspension component of a disk drive, the head suspension component comprising:
   a spring metal layer;
   an insulating material layer on the spring metal layer;
   a strain gauge sensor formed from a layer of a strain gauge metal disposed on the insulating material layer; and
   a trace extending along the insulating material layer, the trace comprising a seed layer formed from the layer of the strain gauge metal, the trace further comprising a layer of a conductive metal disposed directly on the seed layer, the strain gauge metal comprising a different type of metal than the conductive metal,
   wherein the seed layer and the strain gauge sensor are formed on different portions of the insulating material layer with respect to each other.

14. The head suspension component of claim 13, wherein the strain gauge metal has higher resistivity than the conductive metal.

15. The head suspension component of claim 13, wherein the strain gauge metal is deposited by a sputtering process and the conductive metal is deposited by a plating process.

16. The head suspension component of claim 13, wherein the strain gauge metal is constantan.

17. The head suspension component of claim 13, wherein the strain gauge sensor comprises a series of linear portions of the layer of the strain gauge metal in a serpentine pattern.

18. The head suspension component of claim 13, further comprising an additional layer of material disposed on the layer of the strain gauge metal.

19. The head suspension component of claim 13, wherein:
   the head suspension component comprises a flexure;
   the flexure has one or more of a gimbal region including spring arms, a load beam mounting region, a primary spring region, and a baseplate mounting region; and
   the strain gauge sensor is on one or more of the gimbal region, the load beam mounting region, the primary spring region, and the baseplate mounting region.

20. The head suspension component of claim 13, wherein the strain gauge metal is a copper-nickel alloy.

21. The head suspension component of claim 20, wherein the conductive metal is copper.

22. A method of manufacturing an integrated lead suspension component of a flexure, the method comprising:
   depositing a layer of insulating material on a layer of spring metal of the flexure;
   sputtering a trace seed layer of high resistance metal on the layer of insulating material, the trace seed layer having a bottom side that faces the layer of insulating material and a top side that is opposite the bottom side, the high resistance metal comprising a copper-nickel alloy; and
   forming a trace by plating a layer of a low resistance conductive metal on the top side of the trace seed layer,
   wherein the low resistance conductive metal is a different type of metal than the copper-nickel alloy of the high resistance metal, and the low resistance conductive metal has a lower electrical resistance as compared to the high resistance metal.

* * * * *